(12) United States Patent
Tsironis

(10) Patent No.: US 10,938,490 B1
(45) Date of Patent: Mar. 2, 2021

(54) CALIBRATION METHOD FOR COUPLER-TUNER ASSEMBLY

(71) Applicant: Christos Tsironis, Dollard-des-Ormeaux (CA)

(72) Inventor: Christos Tsironis, Kirkland (CA)

(*) Notice: Subject to any disclaimer, the term of this patent is extended or adjusted under 35 U.S.C. 154(b) by 309 days.

(21) Appl. No.: 16/176,566

(22) Filed: Oct. 31, 2018

(51) Int. Cl.
| | |
|---|---|
| *G01R 1/04* | (2006.01) |
| *H04B 17/12* | (2015.01) |
| *H04B 17/14* | (2015.01) |
| *H04B 17/19* | (2015.01) |
| *H01R 9/05* | (2006.01) |
| *H01R 24/40* | (2011.01) |

(52) U.S. Cl.
CPC ........... *H04B 17/12* (2015.01); *G01R 1/0416* (2013.01); *H01R 9/0509* (2013.01); *H01R 24/40* (2013.01); *H04B 17/14* (2015.01); *H04B 17/19* (2015.01); *H01R 2201/20* (2013.01)

(58) Field of Classification Search
CPC ........ H04B 17/12; H04B 17/14; H04B 17/19; G01R 1/0416; G01R 31/3191; G01R 33/0023; G01R 35/00; G01R 35/05; H01R 9/0509; H01R 24/40
See application file for complete search history.

(56) References Cited

U.S. PATENT DOCUMENTS

| | | | | |
|---|---|---|---|---|
| 5,034,708 A | * | 7/1991 | Adamian | H01P 5/04 333/161 |
| 5,274,333 A | * | 12/1993 | Ghannouchi | G01R 27/06 324/601 |
| 5,434,511 A | * | 7/1995 | Adamian | G01R 35/005 324/601 |
| 5,442,296 A | * | 8/1995 | Schiek | G01R 35/005 324/601 |
| 5,467,021 A | * | 11/1995 | Adamian | G01R 35/005 324/601 |
| 5,537,046 A | * | 7/1996 | Adamian | G01R 35/005 324/601 |
| 5,548,221 A | * | 8/1996 | Adamian | G01R 35/005 324/601 |
| 5,552,714 A | * | 9/1996 | Adamian | G01R 35/005 324/601 |
| 5,578,932 A | * | 11/1996 | Adamian | G01R 35/005 324/601 |
| 6,653,848 B2 | * | 11/2003 | Adamian | G01R 27/28 324/601 |
| 6,674,293 B1 | | 1/2004 | Tsironis | |
| 6,744,262 B2 | * | 6/2004 | Adamian | G01R 27/28 324/601 |

(Continued)

OTHER PUBLICATIONS

Directional Couplers [online], Microwaves101 [retrieved on Oct. 17, 2018]. Retrieved from Internet <URL: http://www.microwaves101.com/encyclopedia/directionalcouplers.cfm>.

(Continued)

*Primary Examiner* — Patrick Assouad
*Assistant Examiner* — Demetrius R Pretlow

(57) ABSTRACT

Test setup and calibration method for wideband, integrated assemblies of signal couplers with single (wideband) and multi-probe (harmonic) impedance tuners using two-port and four-port network analyzers for exact wave and time-domain measurements of strongly mismatched poor directivity ultra-wideband coupler-tuner configurations.

4 Claims, 12 Drawing Sheets

(56) References Cited

U.S. PATENT DOCUMENTS

| | | | | |
|---|---|---|---|---|
| 6,757,625 B2* | 6/2004 | Adamian | G06F 30/367 | |
| | | | 702/57 | |
| 6,826,506 B2* | 11/2004 | Adamian | G01R 27/28 | |
| | | | 324/601 | |
| 6,853,198 B2* | 2/2005 | Boudiaf | G01R 27/28 | |
| | | | 324/601 | |
| 6,920,407 B2* | 7/2005 | Adamian | G01R 27/28 | |
| | | | 324/601 | |
| 6,937,032 B2* | 8/2005 | Adamian | G01R 27/28 | |
| | | | 324/601 | |
| 7,019,535 B2* | 3/2006 | Adamian | G01R 35/005 | |
| | | | 324/601 | |
| 7,068,049 B2* | 6/2006 | Adamian | G01R 27/28 | |
| | | | 324/612 | |
| 7,126,346 B2* | 10/2006 | Adamian | G06F 30/36 | |
| | | | 324/638 | |
| 7,135,941 B1* | 11/2006 | Tsironis | H01P 5/04 | |
| | | | 333/17.3 | |
| 7,157,918 B2* | 1/2007 | Adamian | G01R 35/005 | |
| | | | 324/601 | |
| 7,248,866 B1* | 7/2007 | Tsironis | G01R 27/32 | |
| | | | 324/642 | |
| 7,282,926 B1 | 10/2007 | Verspecht et al. | | |
| 7,548,069 B2* | 6/2009 | Simpson | G01R 27/28 | |
| | | | 324/537 | |
| 8,410,862 B1* | 4/2013 | Tsironis | H01P 5/04 | |
| | | | 333/17.3 | |
| 8,841,921 B1* | 9/2014 | Tsironis | G01R 1/06772 | |
| | | | 324/601 | |
| 8,975,988 B1* | 3/2015 | Tsironis | H01P 5/04 | |
| | | | 333/263 | |
| 9,041,498 B1* | 5/2015 | Tsironis | H01P 5/04 | |
| | | | 333/263 | |
| 9,625,556 B1 | 4/2017 | Tsironis | | |
| 2003/0173975 A1* | 9/2003 | Adamian | G01R 27/28 | |
| | | | 324/601 | |
| 2003/0173978 A1* | 9/2003 | Adamian | G01R 27/28 | |
| | | | 324/638 | |
| 2003/0200039 A1* | 10/2003 | Adamian | G06F 30/367 | |
| | | | 702/65 | |
| 2004/0160230 A1* | 8/2004 | Adamian | G01R 27/28 | |
| | | | 324/638 | |
| 2004/0193382 A1* | 9/2004 | Adamian | B82Y 40/00 | |
| | | | 702/118 | |
| 2005/0030047 A1* | 2/2005 | Adamian | G01R 27/28 | |
| | | | 324/650 | |
| 2005/0091015 A1* | 4/2005 | Adamian | G06F 30/367 | |
| | | | 703/2 | |
| 2005/0138577 A1* | 6/2005 | Adamian | G06F 30/36 | |
| | | | 716/113 | |
| 2006/0181286 A1* | 8/2006 | Adamian | G01R 35/005 | |
| | | | 324/601 | |
| 2008/0238441 A1* | 10/2008 | Rhymes | G01R 29/26 | |
| | | | 324/601 | |
| 2013/0147535 A1* | 6/2013 | Hur | H01P 5/18 | |
| | | | 327/231 | |
| 2014/0354294 A1* | 12/2014 | Boudiaf | G01R 35/00 | |
| | | | 324/537 | |
| 2015/0073749 A1* | 3/2015 | Simpson | G01R 27/28 | |
| | | | 702/182 | |

OTHER PUBLICATIONS

Sischka, Franz, "Basics of S-Parameters, part 1", Characterization handbook, Mar. 2002.
Tucker, R.S. and Bradley P., "Computer-Aided Error Correction of Large-Signal Load-Pull Measurements", IEEE Transactions on Microwave Theory and Techniques, vol. MTT-32, No. 3, Mar. 1984, p. 296-300.
Fourier Transformation [online], Wikipedia [retrieved on Oct. 17, 2018] Retrieved from Internet <URL: http://en.wikipedia.org/wiki/Fourier transform>.
"MPT, a Universal Multi-Purpose Tuner", Product Note 79, Focus Microwaves Inc., Oct. 2004.
"Agilent 8720E Family, Microwave Vector Network Analyzers" [online], Agilent Datasheet, [Retrieved on Oct. 30, 2018]. Retrieved from Internet <URL: https://literature.cdn.keysight.com/litweb/pdf/5968-5163Epdf>.
"Shockline 4-Port Performance VNA, MS46524B" [online], Anritsu America Datasheet [retrieved on Sep. 28, 2018], Retrieved from Internet <URL: https://www.anritsu.com/en-US/test-measurement/products/ms46524b>.

* cited by examiner

TUNING PROBE

TUNING PROBES

CALIBRATION METHOD FOR COUPLER-TUNER ASSEMBLY

PRIORITY CLAIM

Not Applicable

CROSS-REFERENCE TO RELATED ARTICLES

1. Directional Couplers [online], Microwaves101 [retrieved on 2018-10-17]. Retrieved from Internet <URL: http://www.microwaves101.com/encyclopedia/directionalcouplers.cfm>.
2. SISCHKA, Franz, "Basics of S-Parameters, part 1", Characterization handbook, March 2002.
3. SIMPSON, G. U.S. Pat. No. 7,548,069, "Signal measurement systems and methods".
4. TSIRONIS, C. U.S. Pat. No. 7,135,941, "Triple probe automatic slide screw load pull tuner and method".
5. VERSPECHT, J. et al. U.S. Pat. No. 7,282,926, "Method and an apparatus for characterizing a High-Frequency Device-Under-Test in a Large Signal Impedance Tuning Environment".
6. TSIRONIS, C. U.S. Pat. No. 6,674,293, "Adaptable Pre-matched Tuner System and Method".
7. TUCKER, R. S. and BRADLEY P., "Computer-Aided Error Correction of Large-Signal Load-Pull Measurements", IEEE Transactions on Microwave Theory and Techniques, vol. MTT-32, No. 3, March 1984, p. 296-300.
8. Fourier Transformation [online], Wikipedia [retrieved on 2018-10-17] Retrieved from Internet <URL: http://en.wikipedia.org/wiki/Fourier_transform>.
9. "MPT, a Universal Multi-Purpose Tuner", Product Note 79, Focus Microwaves Inc., October 2004.
10. "Agilent 8720E Family, Microwave Vector Network Analyzers" [online], Agilent Datasheet, [Retrieved on Oct. 30, 2018]. Retrieved from Internet <URL: https://literature.cdn.keysight.com/litweb/pdf/5968-5163E.pdf>.
11. "Shockline 4-Port Performance VNA, MS46524B" [online], Anritsu America Datasheet [retrieved on 09-28-2018], Retrieved from Internet <URL: https://www.anritsu.com/en-US/test-measurement/products/ms46524b>.
12. TSIRONIS, C. U.S. Pat. No. 9,625,556, "Method for calibration and tuning with impedance tuners".

BACKGROUND OF THE INVENTION

This invention relates to high power (nonlinear) testing of microwave transistors (DUT) in the frequency and time domain. When the transistor is driven in its nonlinear operation regime, a sinusoidal input electrical signal is deformed, and the output signal contains harmonic components, described following Fourier's analysis of periodic non-sinusoidal time quantities. The electrical signals injected at the input of the DUT and extracted at the output can be sampled using signal sampling devices, such as signal couplers (see ref. 1), wave-probes (see ref. 5) or IV probes (see ref. 3) and processed by appropriate signal analyzers (see ref. 7). It is false to claim (see ref. 3, column 10, paragraphs f), g) h) and ref. 5 column 9 lines 50 to 67), that the use of an integrated coupling probe makes full tuner-coupler assembly calibration superfluous and allows direct measuring of the tuned impedance through the signal receiver. This statement is inaccurate in itself, even though the error appears only when coupler directivity is low and tuner reflection factor is high, which is, unfortunately, often the case.

DESCRIPTION OF PRIOR ART

A typical test setup allowing sampling electrical signals at the input and output of a DUT in nonlinear operation regime is shown in FIG. 1. In this setup the source and load impedances are nominally 50Ω (the standard characteristic impedance of microwave transmission lines today). Other characteristic impedances can be used, such as 75Ω; the important element here is that the source and load impedances are wideband and constant over the frequency range. The input and output signal couplers (known also as "wave-probes", FIG. 2) extract a small portion of the RF power waves a(t) and b(t) which are injected and extracted from the DUT and injects them into the tuned signal receiver, which measures the fundamental and harmonic components of it and may display the time function, using inverse Fourier transformation (see ref. 8). This is necessary because high frequency (microwave) receivers are easier to manufacture in form of "tuned" harmonic receivers than "real time" receivers.

The impedance tuners in the setup of FIG. 1 provide additionally for source and/or load impedance control at the fundamental frequency Fo and, when appropriate, "harmonic impedance tuners" (see ref. 9) are used for controlling the harmonic impedances at 2Fo, 3Fo etc. The tuners are used to synthesize and optimize the DUT's performance for certain criteria, such as output power, gain, power added efficiency, linearity etc.

BRIEF DESCRIPTION OF THE INVENTION

This invention discloses a method for calibrating wideband, integrated and adjustable signal couplers with single (wideband) and multi-probe (harmonic) impedance tuners. The signal coupler is made of micro-coaxial semi-rigid cable of which the shielding mantle and Teflon core have been removed at a short section and the cable is folded at this section exposing the center conductor in "U" form. The cable with the "U" section in front is inserted into a radial slot of a coaxial airline and penetrates such that the exposed "U" center conductor segment is coupled electromagnetically with the signal travelling along the center conductor. The electrically created and magnetically induced currents add in the coupled branch of the coupler and subtract in the isolated branch (see ref. 5, FIGS. 4 and 5). The difference is called directivity. In the following we use the term "coupler", "signal coupler" or "wave-probe" in equal terms, describing the same device. When loaded with impedance other than 50Ω the coupling behavior changes because, some signal, reflected at the mismatched port leaks, through the finite directivity, into the coupled and isolated ports (FIG. 2). This effect is taken into account in the calibration method disclosed in this invention.

BRIEF DESCRIPTION OF THE SEVERAL VIEWS OF THE DRAWINGS

The invention and its mode of operation will be more clearly understood from the following detailed description when read with the appended drawings in which:

FIG. 9A depicts the coupler attached to the test port of a single probe tuner; FIG. 9B depicts the coupler attached to the idle port of a single probe tuner; FIG. 9C depicts the coupler attached to the test port of a multi-probe tuner; FIG. 9D depicts the coupler attached to the idle port of a multi-probe tuner.

DETAILED DESCRIPTION OF THE INVENTION

Figure 4:
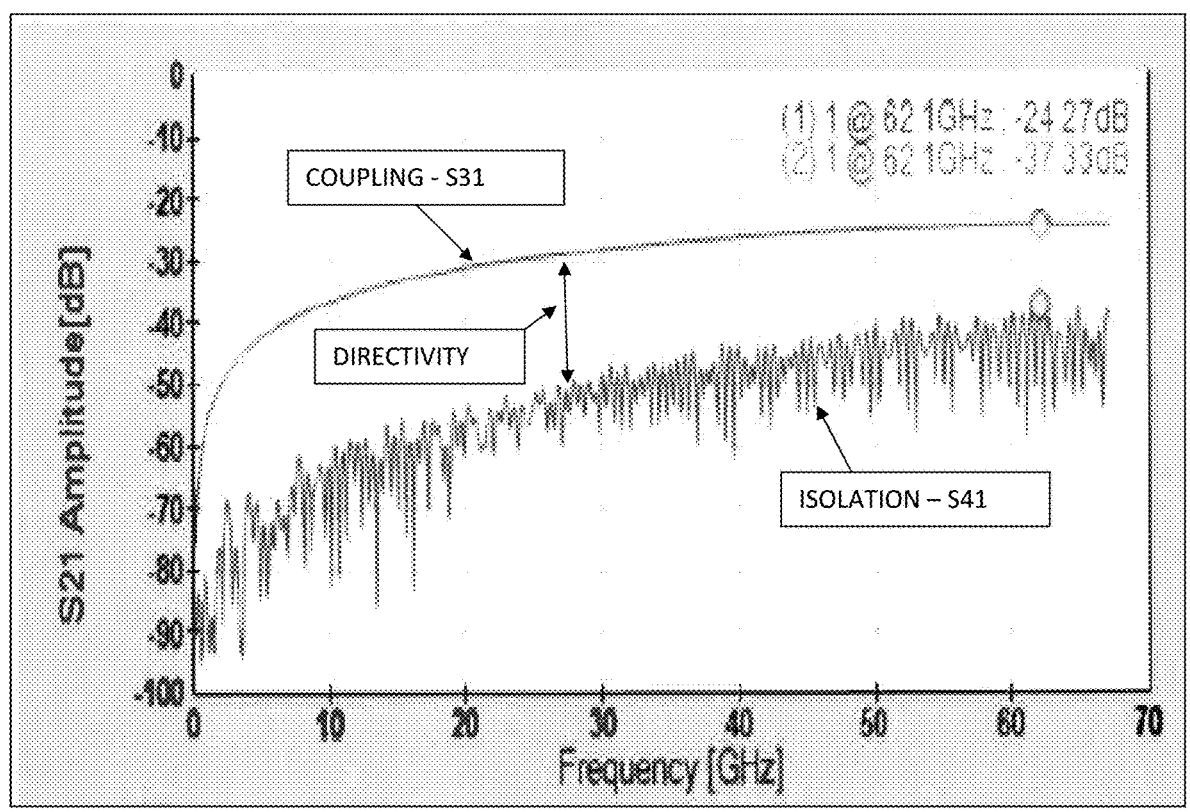
FIG. 4 depicts prior art: coupling factor, isolation and directivity of signal coupler (wave-probe).
Figure 5:
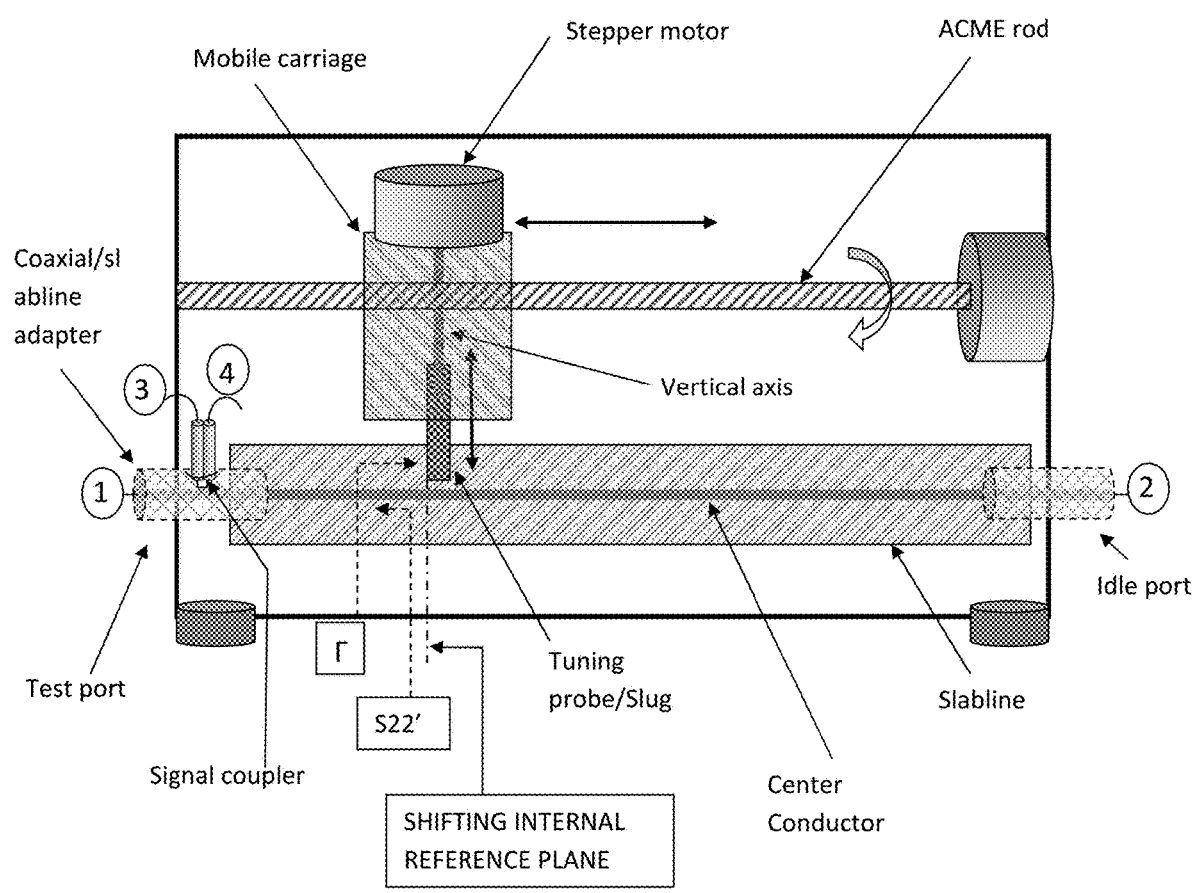
FIG. 5 depicts integration of signal coupler in single probe impedance tuner, the coupler mounted on the test port side.
Figure 7:
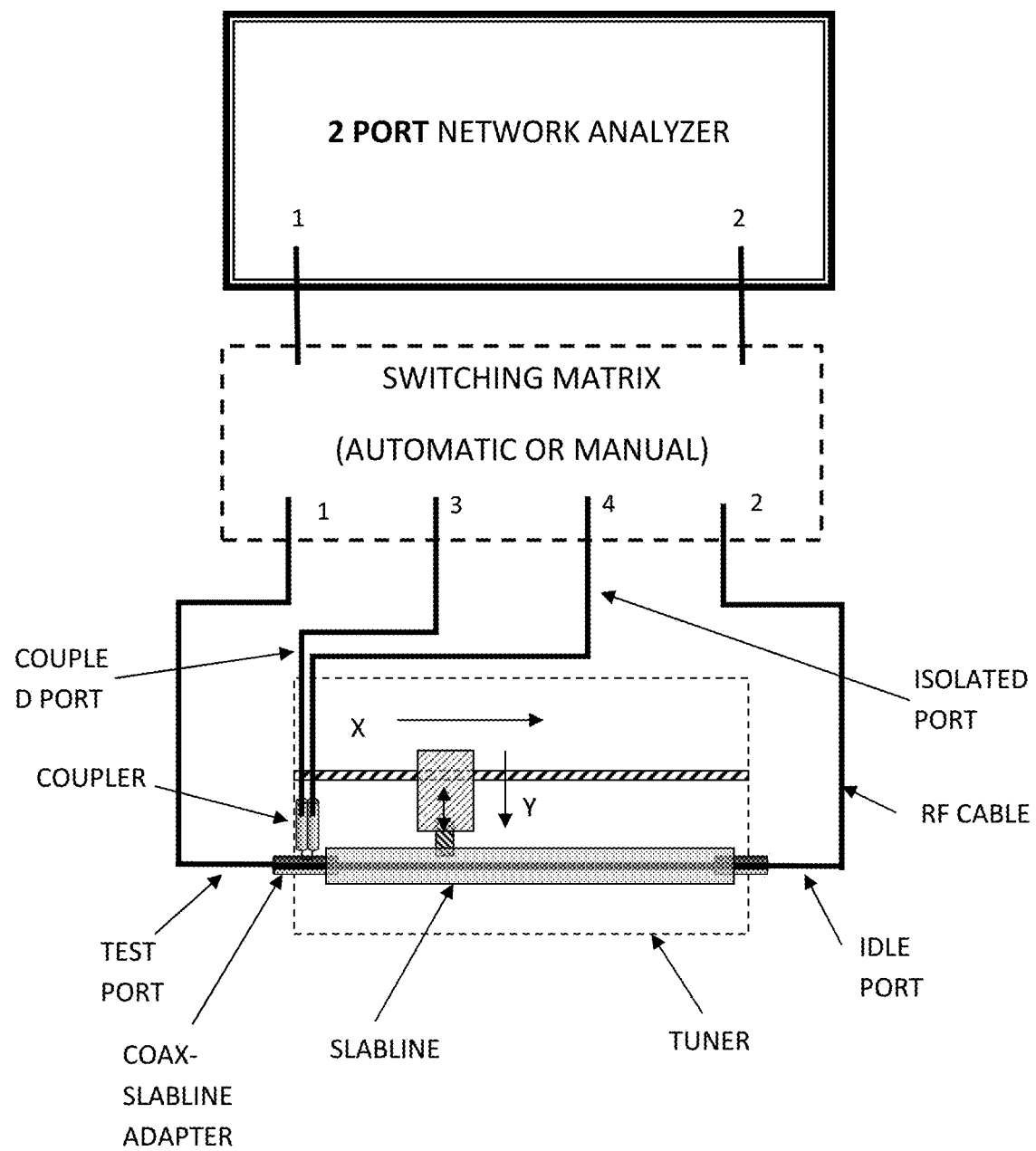
FIG. 7 depicts coupler-single-probe tuner assembly calibration setup using two-port network analyzer.

Isolation (S41) in the signal coupler (FIG. 7) is due to combination of the electrically induced current $I_E$ which adds up with the magnetically induced current $I_H$ in the coupled branch and subtracting in the isolated branch (see ref. 5, FIGS. 4 and 5). Said currents cannot be measured directly, only the signal ratio between the coupled and isolated port can be measured and it is proportional to the ratio $(I_E+I_H)/(I_H-I_E)$. Directivity decreases with frequency. This is obviously caused by parasitic capacitive coupling phenomena bypassing the core of the basic electro-magnetic coupling mechanism.

Figure 1:
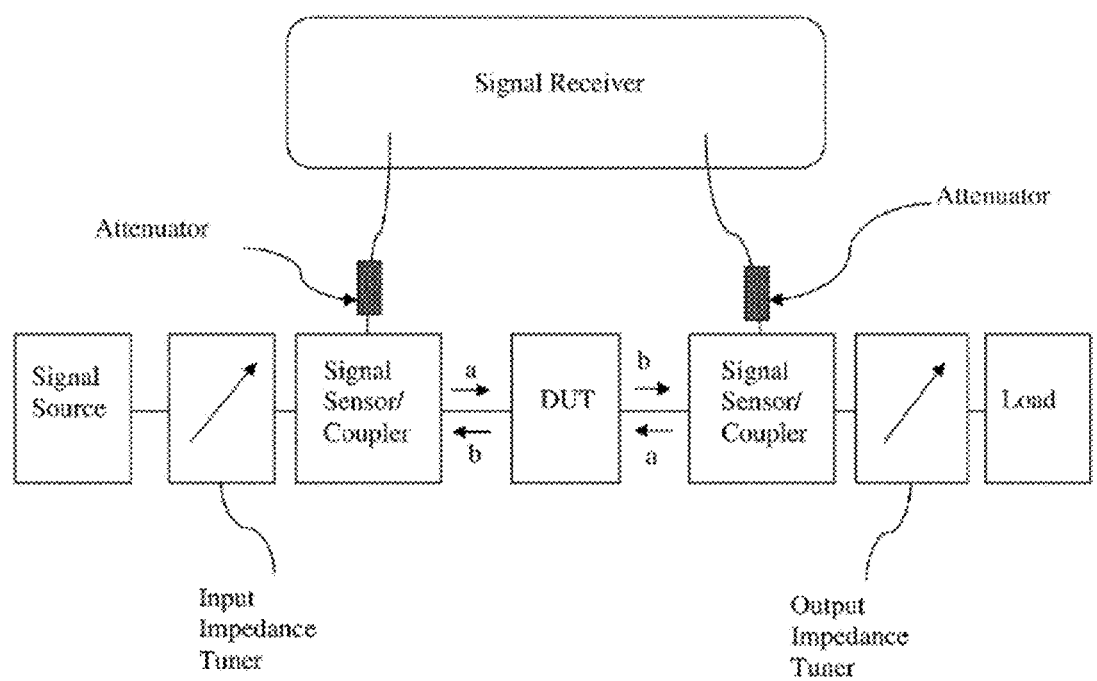
FIG. 1 depicts prior art, a signal measurement system using signal probing.
Figure 3:
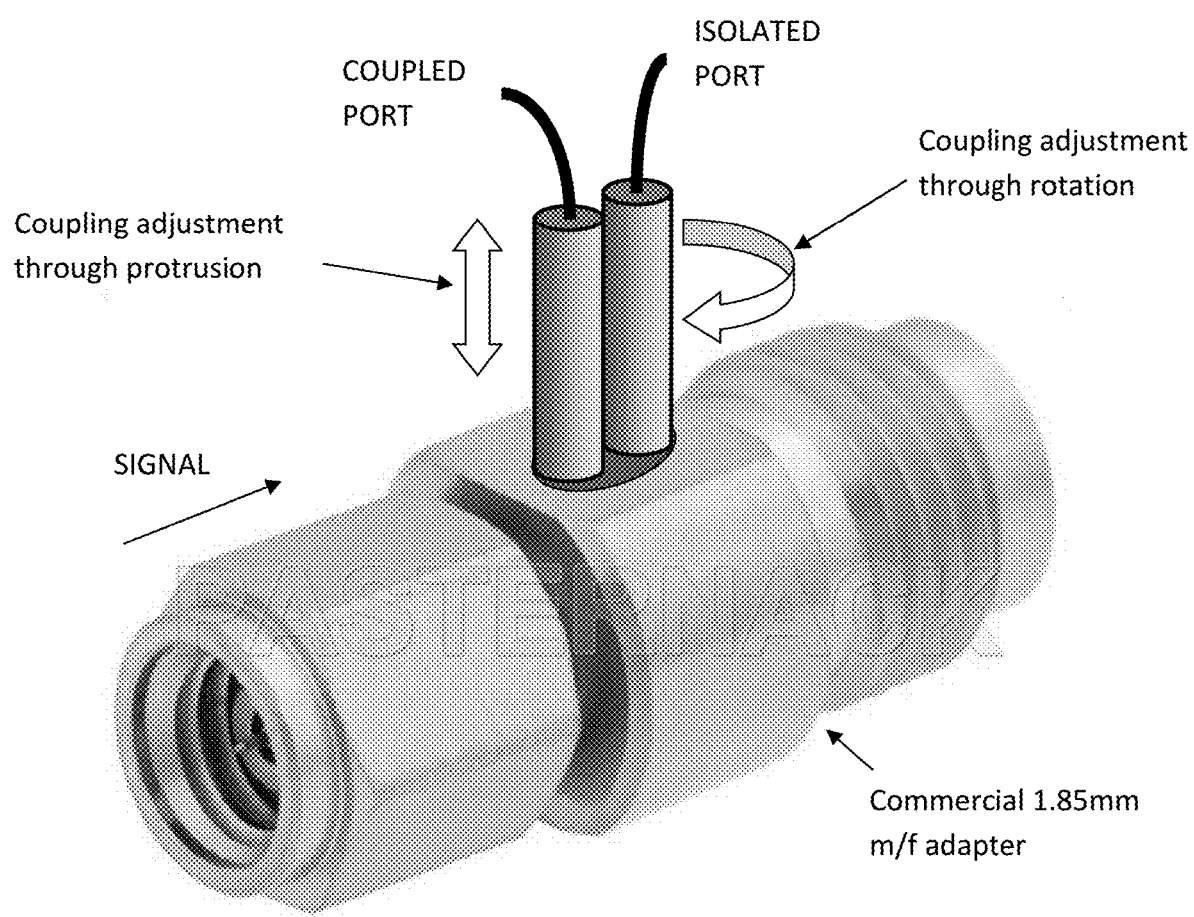
FIG. 3 depicts the signal coupler made of a commercially available 1.85 mm coaxial male to female adapter.

All interconnections between RF components are in general coaxial. A coaxial signal coupler integrating seamlessly into a coaxial environment is, therefore, the natural solution. If, in a specific setup using a standard non-adjustable coupler, the signal generated by the DUT is too weak for the receiver sensitivity, then, a different coupler with higher coupling factor must be selected and the setup must be disassembled, re-assembled and re-calibrated. If the signal is too strong, once again, the cables to the receiver must be disconnected and attenuators must be inserted (FIG. 1). Also, the signal may be weak at the input and strong at the output of the device, further complicating the situation. The coupling factor of the coupler must be easily adjustable and, once adjusted, it only needs to be re-calibrated, without disassembling. The signal coupling factor increases with frequency, thus favoring detection of harmonic components which are generated by the nonlinearly operated RF transistors and, typically, decrease with frequency. In order to adapt also to various power levels and associated harmonic receiver sensitivity (FIG. 1), instead of using external attenuators, the coupling factor can be adjusted either by controlling the penetration of the loop inside the airline cavity or by rotating the loop around its vertical axis (FIG. 3).

Figure 6:
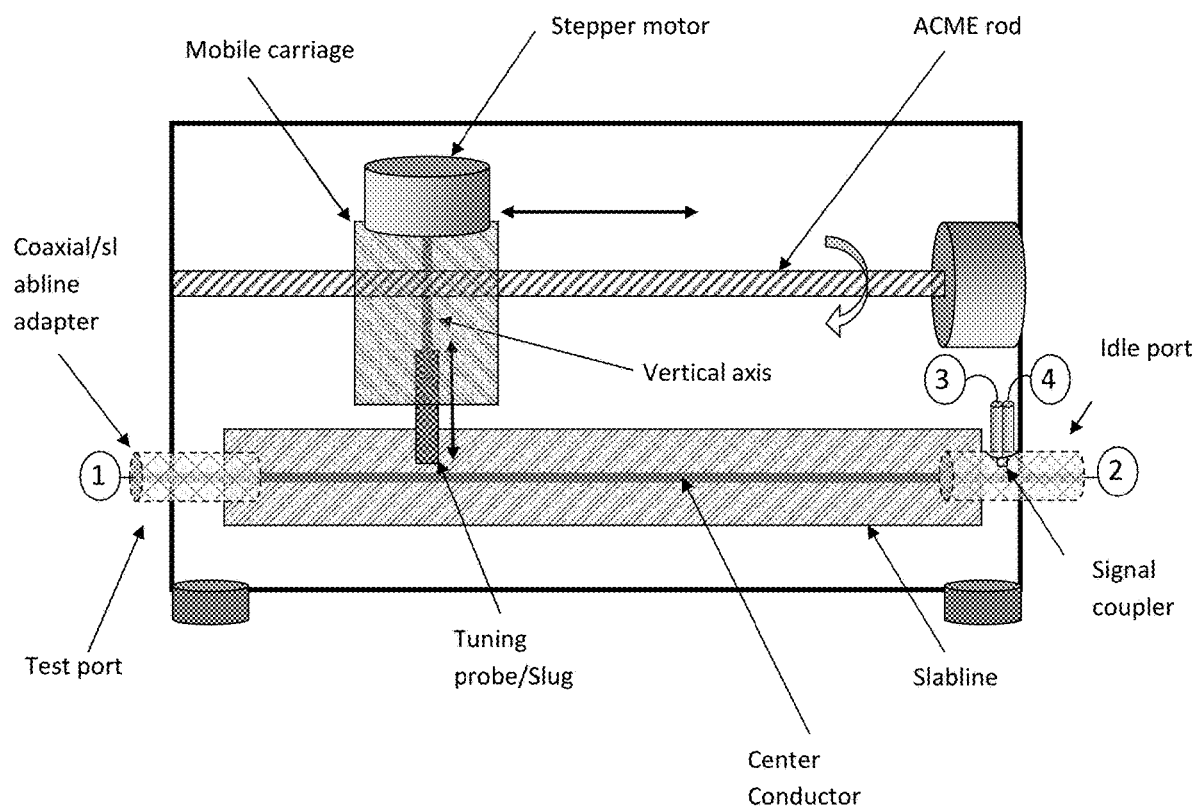
FIG. 6 depicts integration of signal coupler in single probe impedance tuner, the coupler mounted on the idle port side.

The compactness, adequate performance (FIG. 4) and coaxial compatibility of the new coupler (FIG. 3) allows for seamless integration in an impedance tuner, see FIG. 5. The tuner itself has a slabline as main transmission line, but, since all interconnections between equipment are coaxial, it requires two coax-to-slabline adapters on each of its ports, the test and the idle port, to match the parallel plate (slabline) electro-magnetic propagation environment to the coaxial one. Therefore, integrating the coupler inside the coaxial, better shielded environment of the coaxial section of the transmission line seems the natural choice. The sex of the coaxial adapters is chosen to match the adjacent equipment for using a minimum of equipment interconnections. All tuners use this technique. The tuner may have one or more mobile carriages, each carriage having a remotely controlled precision vertical axis carrying tuning probes (slugs). The coupler is mounted either on the test port side (FIG. 5) or on the idle port side (FIG. 6). Measurement is possible in both cases using appropriate calibration and corrections. However, mounting on the idle port side will allow a reduced amount of signal to reach the coupler because of the loss of the tuner, especially when it tunes at high VSWR; this creates increased demand on receiver sensitivity and dynamic range. However, since the compact coupler is mounted on the coax-slabline adapter, no further negative impact is there on tuner design and performance when mounted either on the side of the test or the idle port: The total slabline length is the same and the small residual reflection of the coupler is easily taken care of in the measurement corrections. The small residual reflection caused by the coupler affects both methods of mounting, test- and idle-port side, and must be taken into account by calibration in both cases.

Figure 2:
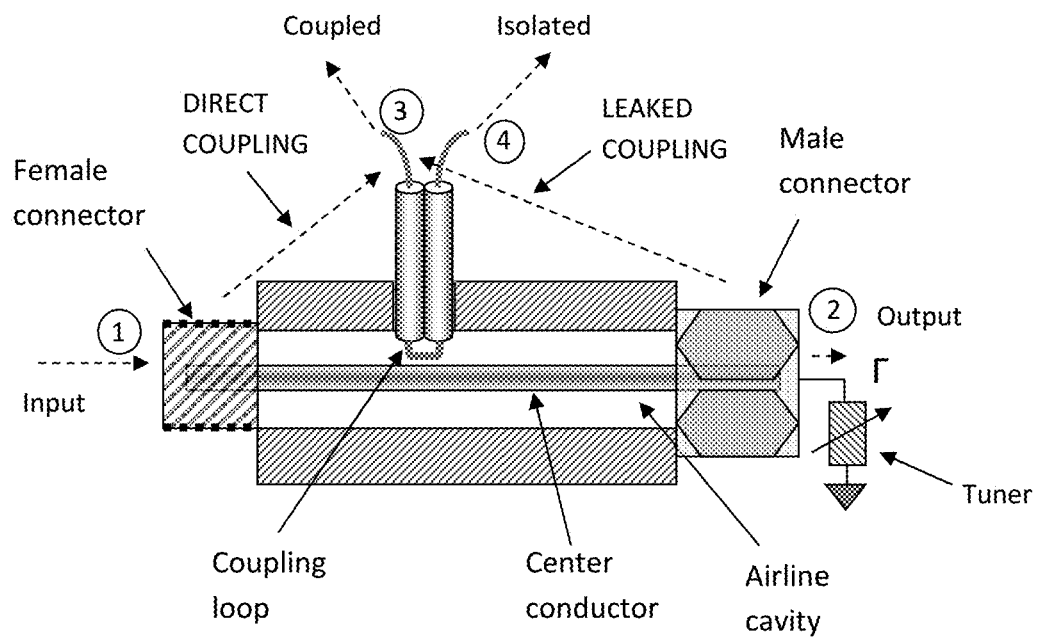
FIG. 2 depicts prior art, the concept of the signal coupler (wave-probe), ref. 5 connected to a non 50Ω load.

It is well known that in signal couplers, the coupled signal at port 3 comes from both the input port 1 and the output port 2 (FIG. 2), if port 2 is not perfectly matched. The signal portion detected at the coupled port 3 is composed of the (desired) directly coupled part, coming from the input port 1, and the (undesired) leakage part, coming from the output port 2, if port 2 is mismatched. The difference (in dB) of the coupled signal part to the leaked signal part is called "Directivity" of the coupler (see ref. 1 and 6). S-parameters (see ref. 2) completely describe the behavior of the coupler and its coupling behavior. The coupling factor CF between port 1 and port 3, as long as port 2 is matched (i.e. the load on port 2 is set to $\Gamma_{Load}=0$, or $Z=Z_0=50\Omega$) is CF=S31. But if the load at port 2 is different than $50\Omega$ (or $\Gamma_{Load} \neq 0$), then some part of the traversing main signal will be reflected at port 2 and will leak to port 3. Thus the effective coupling factor CF will change, and, for accurate measurements, it must be corrected. Equally, any reflected power at port 2 will be detected at port 4, because port 4 if "forward coupled" with port 2, in addition to the directly leaked power from port 1 to port 4.

The remaining, and yet unsolved task, is how to calibrate the coupler and the tuner as an integrated unit in the same housing as disclosed in ref. 3, claim 27. In ref. 3 Simpson does disclose an integrated assembly of signal coupler and impedance tuner, but no method for calibrating it correctly. It is important to note, that, if the coupler-tuner assembly is not calibrated properly, it will yield false measurement data and is therefore useless. The method disclosed here allows accurate calibration of the integrated assembly. It shall also be noted, that even if the signal coupler and the tuner are separate units, it is preferable to calibrate them as a single unit, in order to avoid connecting and disconnecting them, which would create RF repeatability errors.

The signal-coupler (FIG. 2) is a four-port and fully described by its $2^4=16$ S-parameters Sij for $\{i,j\}=\{1,4\}$. S-parameters are defined when all measurement ports are matched (terminated with 50Ω). When one or more ports are not matched, then we cannot speak of S-parameters; we use the generalized term C-parameters ("C" stands for coupler). This happens when the coupler is either connected to, or is part of a network including a tuner, as is the case in this invention, which tuner changes the impedance. In the simplest form, the effect of limited directivity of the coupler is demonstrated by equation 1:

$$C13(x,y)=C31(x,y)=S31+(S32'*S21'*\Gamma)/(1-S22'*\Gamma), \quad \{eq.1\}.$$

wherein annotated S-parameters: leakage S32', transfer: S21' and reflection factor: S22' related to ports 1, 3 and 2 and the internal virtual reference plane shown in FIG. 5 defining S22' and Γ. Herein the quantities S22' and Γ are internal inside the assembly: they are both defined at the internal shifting (dynamic) reference plane of the moving tuning probe (FIG. 5) They become predominant when port Γ is high (i.e. when the tuning probe is inserted). The amplitude of |S22'| instead is small, if port 1 is matched. But in normal circumstances port 1 is connected to the DUT, i.e. this condition is not valid either. In short, a rational analysis of the situation is intricate and meaningless. Of course there is also the problem of understanding how a moving reference plane can be handled, but this is part of the calibration method disclosed here.

Figure 9A:
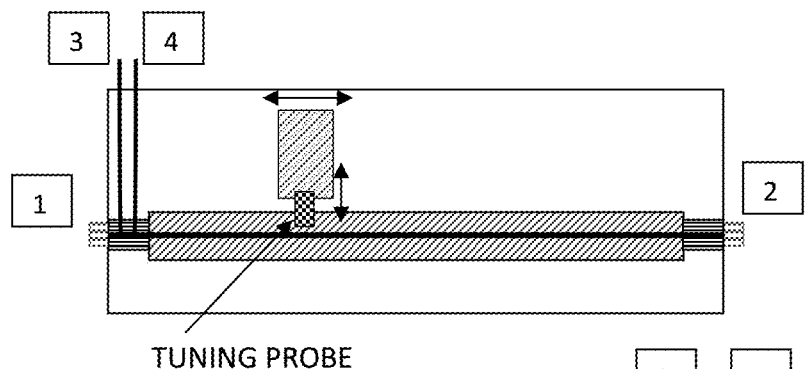
FIGS. 9A through 9D depict four distinct integrated coupler-tuner configurations.
Figure 9B:
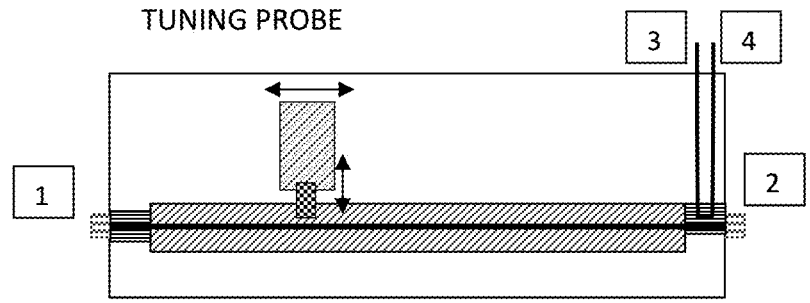
Figure 9C:
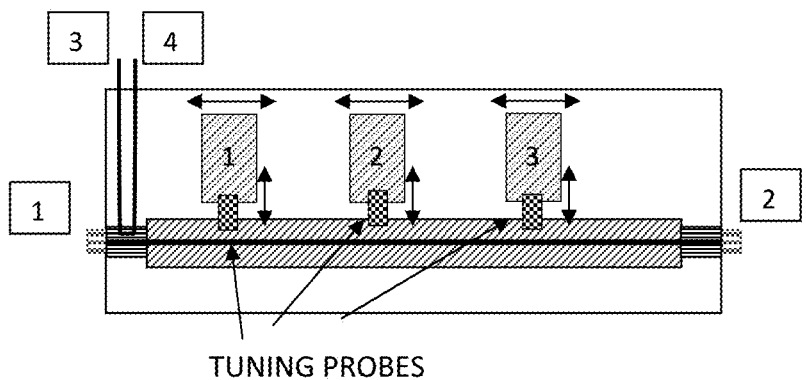
Figure 9D:
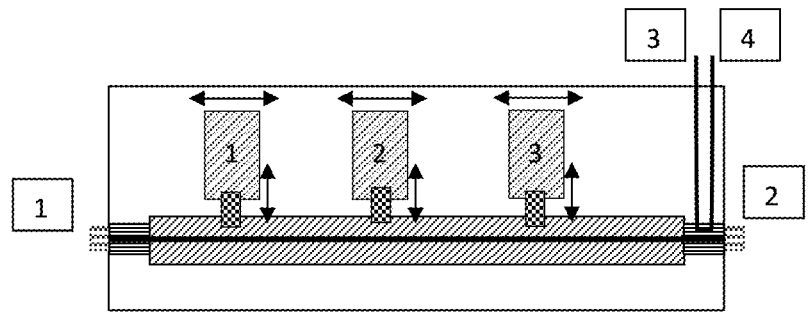

The coupler in a non-matched environment must be fully calibrated or the results of the measurement will be false. We have two possible tuner types FIG. 9 (single probe FIGS. 9A and 9B and multi-probe FIGS. 9C and 9D tuners) and two possible configurations (coupler adjacent to test port FIGS. 9A and 9C and coupler adjacent to idle port of the tuner FIGS. 9B and 9D); or in total four distinct cases. Each configuration must be considered independently.

In case 1 (single-probe tuner, FIG. 9A and FIG. 9B): Port 1 is the input port, port 2 is the output port, port 3 is the forward coupled port and port 4 is the reverse coupled port. The coupler is located either between the test port and the tuning probe or between the tuning probe and the idle port. This means that, when the tuning probe is inserted into the slabline and creates a reflection factor most S-parameters will change: S11 will, of course, change, because there is returning signal reflected by the probe, the same for S22; in case of FIG. 9A S31 will change because signal reflected at the probe will leak into port 3, S42 will change because some of the signal traversing from port 2 to port 4 will be affected (reduced) by the tuning probe, etc. Alternatively in the configuration of FIG. 9B the effects on S31 and S42 will be reversed. All this must be taken into account in the calibration procedure: At any given frequency Fo, calibration comprises the following steps: (a) measure S-parameters between all other port combinations {mn}=(12, 13, 23, 24, 14 and 34, or in short form {m,n}={1,4}, m≠n) for a multitude of horizontal (x) and vertical (y) probe positions of the tuner probe and save as Smn.ij(x,y), whereby {i,j}={1,2} and save as Smn.ij(x,y).

In case 2 (multi-probe tuner, FIGS. 9C, 9D and 12, see ref. 4 and 6): the calibration and operation occur at fundamental (Fo) and one (2Fo) or two (2Fo and 3Fo) harmonic frequencies, since multi-carriage tuners serve also for harmonic tuning (see ref. 9); again port 1 is the input port, port 2 is the output port, port 3 is the forward coupled port and port 4 is the reverse coupled port. The coupler is located either between the test port and the tuning probes or between the tuning probes and the idle port. This means that, when the tuning probes are inserted into the slabline and create a reflection factor most S-parameters will change: S11 will, of course, change, because there is returning signal reflected by the probes, the same for S22; in case of FIG. 9C S31 will change because signal reflected at the probes will leak into port 3, S42 will change because some of the signal traversing from port 2 to port 4 will be affected (reduced) by the tuning probes, etc. Alternatively in the configuration of FIG. 9C the effects on S31 and S42 will be reversed. All this must be taken into account in the harmonic calibration procedure.

At any given fundamental frequency Fo and harmonic frequencies 2Fo (for two-probe tuner) and 2Fo and 3Fo (for three-probe tuner), calibration comprises the following steps: (a) measure the initialization (init) matrices of the assembly at the fundamental and all harmonic frequency F with index N (N=1 for frequency F=Fo, N=2 for F=2Fo, N=3 for F=3Fo), with all tuning probes retracted, between ports 1 and 2 and save as S[012,N], between ports 1 and 3 and save as S[013,N], between ports 1 and 4 and save as [S014,N] between ports 2 and 3 and save as S[023,N], between ports 2 and 4 and save as S[024,N] and between ports 3 and 4 and save as [S034,N]; (b) measure S-parameters between ports 1 and 2 for a multitude of horizontal (x) and vertical (y) probe positions of tuner probe z (z=1, 2, 3 . . . ) and save as S12.N.ij(xz,yz), whereby N=1, 2, 3 . . . , {i,j}={1,2} and correspondingly between all port combinations and save as Smn.N.ij(xz,yz), wherein mn are port combinations as follows: {mn}={1,4} and m≠n, i.e. (12, 13, 14, 23, 24,34). (c) de-embed the measured S-parameters in step (b) by cascading the inverse matrix S[0mn, N]$^{-1}$ with Smn.N.ij(xz,yz) for z>1 and replace the original measured data; at this point S-parameters between all port combinations and all harmonic frequencies are de-embedded with the init matrices for S-parameters associated with all tuning probes except for probe 1. Subsequently S-parameters of all permutations for all probe positions created in step (c) are created in computer memory and saved. If, as an example, each probe z has xz*yz=1000 calibrated positions (or tuner-probe states) the total items of the final calibration matrix for the three harmonic frequencies will contain be M=3*1000$^3$*18=54*10$^9$ complex numbers (S-parameters) or 108*10$^9$ real numbers. The number of different S-parameters is 18 instead of 24 because the assembly is passive and, as such, reciprocal, i.e. S12=S21, S13=S31 etc. Using appropriate coding, sorting and search algorithms, harmonic tuning and associated measurement corrections is possible (see ref. 12). The resulting S-parameters fully describe the four-port coupler assembly for all permutations of the tuning probes and harmonic frequencies.

In all above, an S-parameter matrix [S] comprises 4 complex numbers Sij=Real(Sij)+j*Imag(Sij) for {i,j}={1, 2}, defined (and measured) between ports "i" and "j". In the case of tuners each said complex S-parameter depends on the position x and y of the tuning probe: Sij(x,y). A tuner calibration matrix comprises a number N=x*y of S-parameter matrices, whereby x is the horizontal position and y the vertical position of the tuning probe (slug), N being typically a number between 400 and 1200.

The coupler-tuner assemblies can be calibrated using either two-port (see ref. 10) or four-port (see ref. 11) vector network analyzers (VNA). To measure 4-port S-parameters one has to connect all combinations of two ports between ports m and n at a time to a VNA, this makes for 6 different settings: {m,n}={1,4}, m≠n. In the case of a two-port VNA (see ref. 10) this requires several manual connecting-disconnecting operations, which are time consuming and create connection repeatability issues. This is shown, schematically in FIG. 7, where the four coupler-tuner assembly ports must pair-wise alternatively be connected to the two ports of the VNA the remaining ports being terminated with 50Ω.

Figure 8:
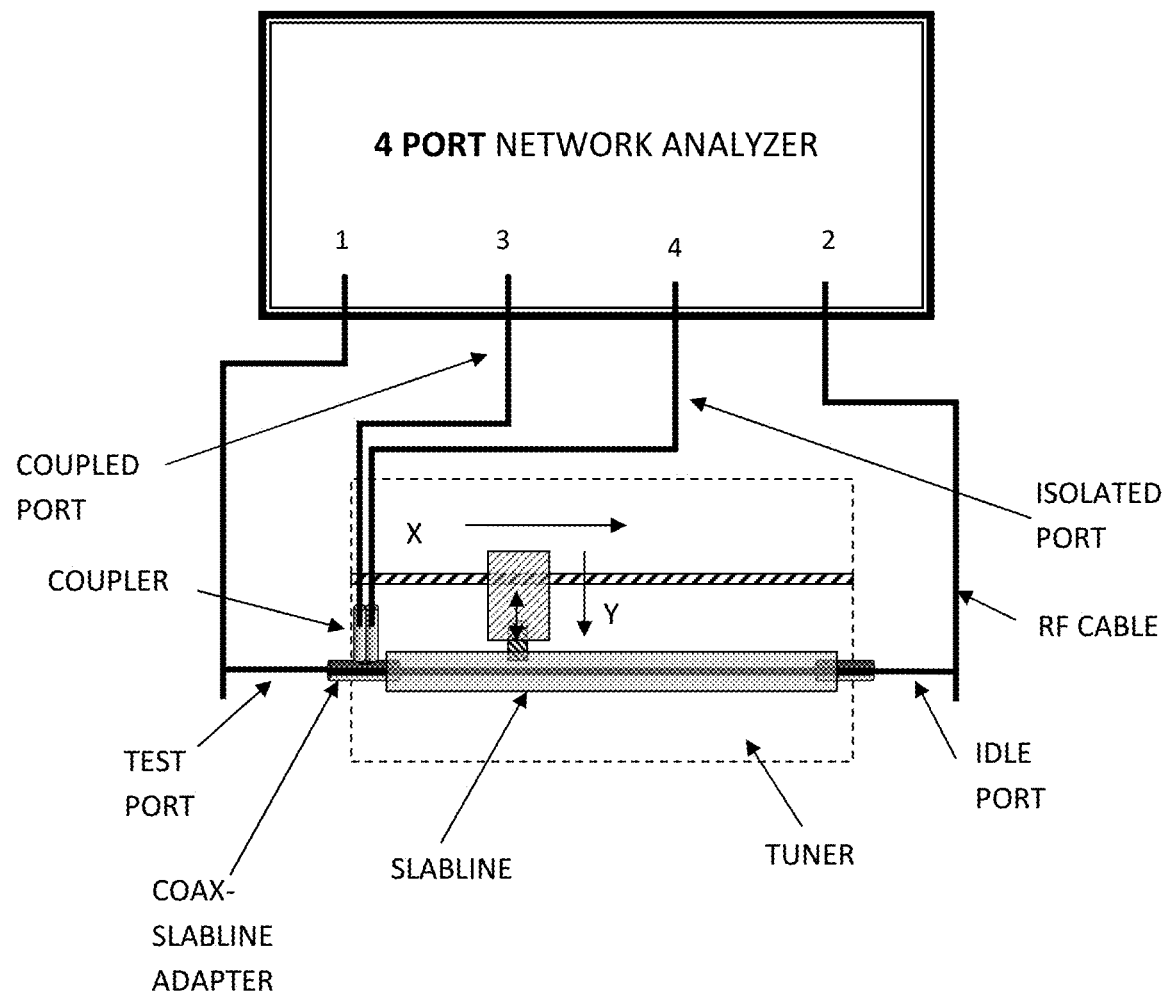
FIG. 8 depicts coupler-single-probe tuner assembly calibration setup using four-port network analyzer, the coupler being attached to the test port.
Figure 10:
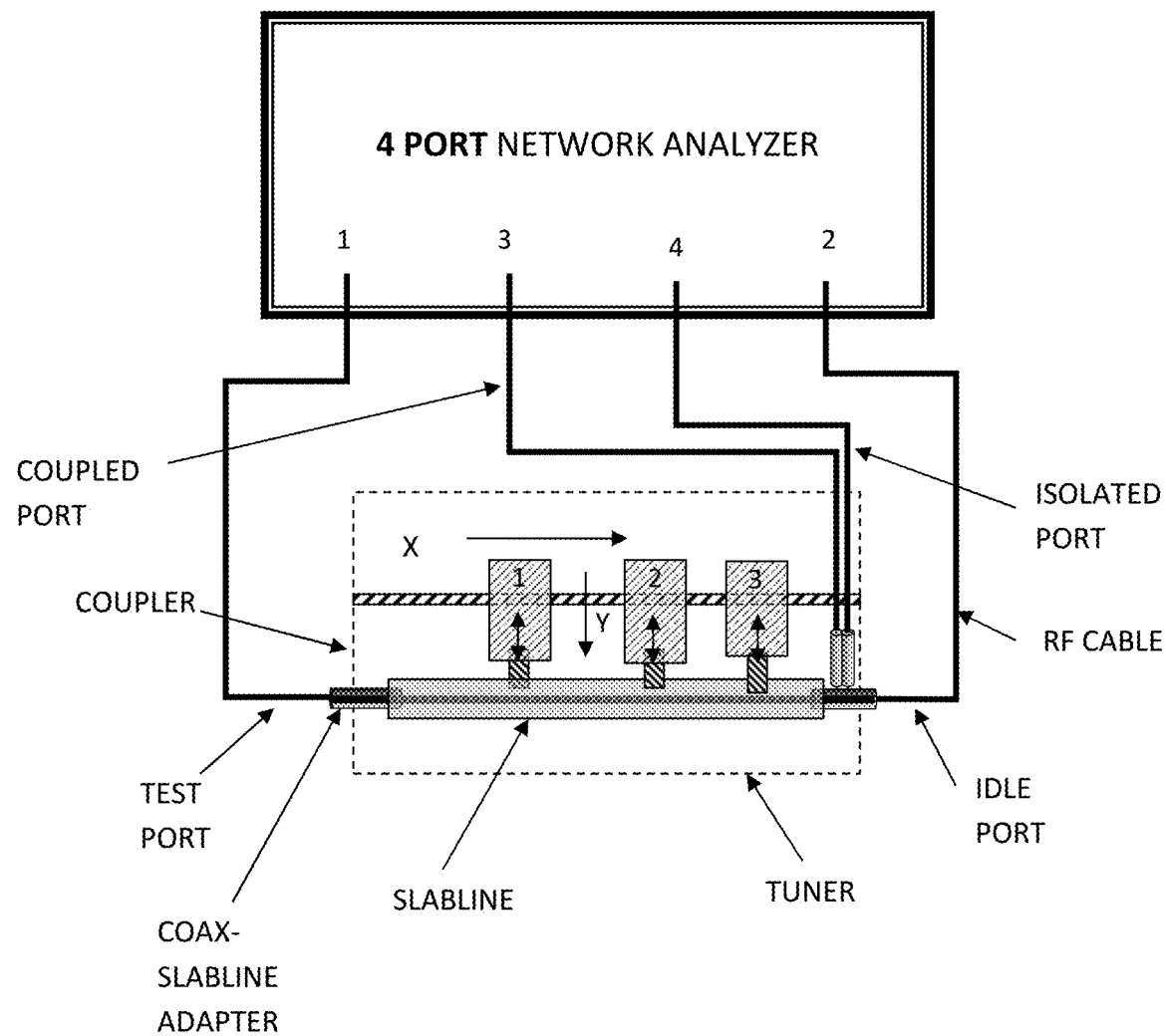
FIG. 10 depicts integrated coupler-multi-probe tuner assembly calibration setup using four-port network analyzer, the coupler attached to the idle port.

But it can be done. On the other hand, four-port VNA (see ref. 11) simplify the task (FIGS. 8 and 10). These instruments operate either using internal switch matrices or other type of signal multiplexing, and deliver 24 sets of S-parameters Sij for {i,j}={1,4} at once. In either case full calibration of the coupler-tuner assembly must proceed this way. The case of a single probe tuner is straight forward. All 18 S-parameters (because of Sij=Sji) are measured and saved for all combinations of horizontal (x) and vertical (y) tuning probe positions without considering internal reflections in the apparatus. This corresponds from 400 to 1200 measurement points.

Figure 12:
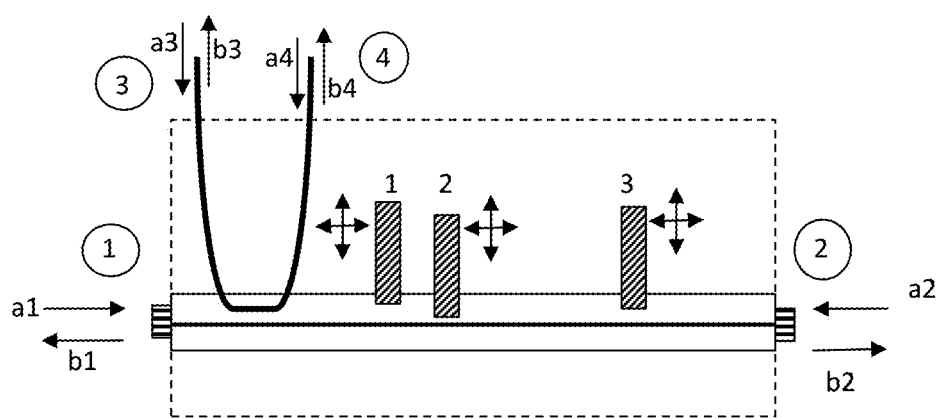
FIG. 12 depicts integrated coupler-multi-probe tuner assembly with power wave definitions.

What is more difficult to understand is when the tuner is multi-probe (FIG. 12). In this case the internal multiple reflections and reference plane shifting is confusing. We cannot calibrate the system for all combinations of all millions of probe permutations, as discussed previously. In this case we measure only the sum of the positions of each probe, de-embed all-but-the-first probe and create the permutations in computer memory. Experimentally this method has been proven accurate. This method accounts for any internal multiple reflection effects.

Figure 11:
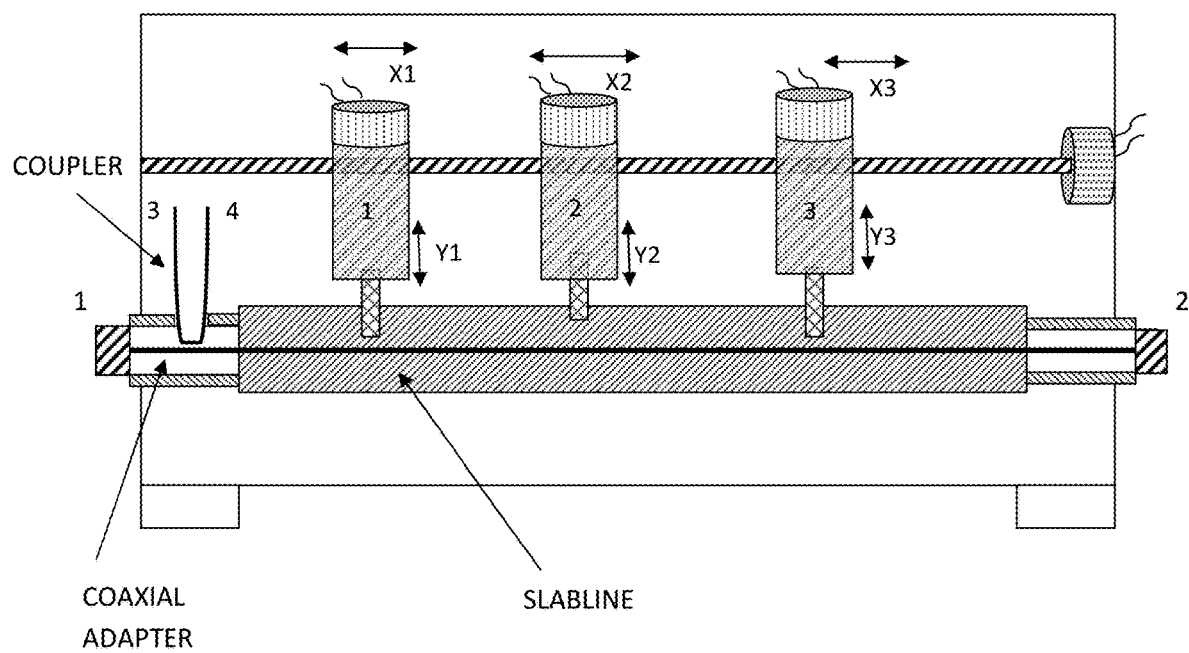
FIG. 11 depicts integrated coupler-multi-probe tuner assembly and port definitions.

To use the calibration in real-time measurements, one has to know the absolute value of the signal power waves into ports 3 and 4, since the actual signal power is travelling between ports 1 and 2 (FIGS. 1 and 11) and the measurement occurs through ports 3 and 4. The original purpose of VNAs is not power measurement: Each VNA port has two detectors (diodes) named R (Reference) and D (Detector); during calibration the ratio D/R is saved, but not the absolute level of R or D. To be able to measure actual power, therefore, the readings of outgoing signal in ports 3 (b3) and 4 (b4) must be calibrated in absolute value, using a calibrated power meter; for b3 and b4 measurement at ports 3 and 4, ports 3 and 4 must be matched, i.e. a3=a4=0. Only then can a user measure actual power injected by the DUT (FIG. 1) to the test port 1 using b3 and S31(x,y): 131=S31(x,y)*b3. The VNA can measure the phase between detectors R and D and, following also a phase calibration, it can provide amplitude and phase information for b1 and a2 for all frequencies (Fo, 2Fo, 3Fo) etc. for using in inverse Fourier transformation (see ref. 8), needed for generating the time domain current and voltage wave-forms. However, this topic is prior art and beyond the scope of the invention.

This invention discloses test setup and algorithms for accurate calibration of the integrated assemblies of signal couplers and tuners for all possible configurations and settings of single and multi-probe tuners.

What I claim as my invention is:

1. A calibration method for integrated coupler-impedance tuner assembly, at a frequency Fo,
   said tuner comprising
   input (test) port and output (idle) port,
   a parallel plate airline (slabline) between the ports,
   one remotely controlled mobile carriage moving parallel to the slabline axis,
   said carriage comprising a remotely controlled vertical axis, carrying a tuning probe insertable into the slot of the slabline;
   and said coupler comprising
   input, output, coupled and isolated ports and
   a coupling section electromagnetically coupled with the center conductor of the slabline;
   wherein the coupler is integrated in the tuner structure
   and wherein input and output ports of the coupler are associated with the test and idle ports of the tuner correspondingly;
   said calibration method comprising S-parameter measurement of all two-port combinations between the test (1), the idle (2), the coupled (3) and the isolated (4) ports for a multitude of horizontal (x) and vertical (y) positions of the tuning probe and saved in calibration file in form of S-parameter matrix [Smn(x,y)] for {m,n}={1,4} and m≠n.

2. A calibration method for integrated coupler-impedance tuner assembly, at frequencies F=N*Fo (1≤N≤M), wherein N=1 corresponds to the fundamental frequency and N=2 . . . M corresponds to harmonic frequencies 2Fo . . . M*Fo, wherein M≤4, said tuner comprising
   input (test) port and output (idle) port,
   a parallel plate airline (slabline) between the ports,
   M remotely controlled mobile carriages moving independently parallel to the slabline axis,
   each said carriage comprising a remotely controlled vertical axis, carrying a
   tuning probe insertable into the slot of the slabline;
   and said coupler comprising
   input, output, coupled and isolated ports and
   a coupling section electromagnetically coupled with the center conductor of the slabline;
   wherein the coupler is integrated in the tuner structure,
   and wherein input and output ports of the coupler are connected to test and idle ports of the tuner correspondingly;
   said calibration method comprising
   (a) S-parameter measurement at all frequencies N*Fo of all combinations of two-ports between the test (1), the idle (2), the coupled (3) and the isolated (4) ports for all tuning probes retracted and saved in init S-parameter matrices [S0mn.N] for {m,n}={1,4}, m≠n;
   (b) S-parameter measurement of all combinations of two-ports between the test (1), the idle (2), the coupled (3) and the isolated (4) ports for a multitude of horizontal (xz) and vertical (yz) positions of all tuning probes z (z=1, 2, 3 . . . ) and saved in calibration file in form of S-parameter matrices [Smn.N.z(xz,yz)] for {m,n}={1,4} and m≠n;
   (c) de-embedding of S-parameter [Smn.N.z(xz,yz)] as in step (b) for z>1, by cascading with the associated init matrices: [S0mn.N]$^{-1}$ and saving;
   (d) creating, in computer memory, cascades of all permutations of S-parameter matrices [Smn.N.z(xz, yz)], as in step (c), and saving in a calibration file.

3. The coupler-tuner assembly as in claim 1 or 2, wherein the coupler is mounted between the test port and the tuning probe next to the test port.

4. The coupler-tuner assembly as in claim 1 or 2, wherein the coupler is mounted between the tuning probe next to the idle port and the idle port.

* * * * *